(12) United States Patent
Kumashiro

(10) Patent No.: US 6,566,695 B2
(45) Date of Patent: May 20, 2003

(54) HYPERBOLIC TYPE CHANNEL MOSFET

(75) Inventor: Shigetaka Kumashiro, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/838,087

(22) Filed: Apr. 19, 2001

(65) Prior Publication Data

US 2001/0038134 A1 Nov. 8, 2001

(30) Foreign Application Priority Data

Apr. 20, 2000 (JP) .......................... 2000-120080

(51) Int. Cl.⁷ .......................... H01L 29/78; H01L 33/00
(52) U.S. Cl. .......................... 257/249; 257/239; 257/59
(58) Field of Search .......................... 257/249, 239, 257/59

(56) References Cited

U.S. PATENT DOCUMENTS 5,644,121 A  *  7/1997  Nakano et al.
5,886,757 A  *  3/1999  Song et al.

OTHER PUBLICATIONS

Tsividis, Yannis P., *Operation and Modeling of The MOS Transistor* 122–131 (1987).

Fischetti, Massimo V., et al., "Monte Carlo analysis of electron transport in small semiconductor devices including band-structure and space-charge effects", *Physical Review*, 38(14): 9721–9745 (1988).

* cited by examiner

*Primary Examiner*—Stephen D. Meier
(74) *Attorney, Agent, or Firm*—Scully, Scott, Murphy & Presser

(57) ABSTRACT

In a MOSFET, a source region, a drain region and a channel region disposed between the source region and the drain region are provided. And the width W(x) of the channel region is changed according to the following mathematical equation.

$$W(x) = \frac{4\{(1+\delta)E_{sat}L + V_{DD} - V_T\}^2 + \{(1+\delta)E_{sat}L + 2(V_{DD} - V_T)\}(V_{DD} - V_T)}{6\{(1+\delta)E_{sat}L\left(1-\frac{x}{L}\right) + V_{DD} - V_T\}\{(1+\delta)E_{sat}L + V_{DD} - V_T\}} W_O$$

In the equation, x denotes a distance from the end of the source region side to the direction toward the drain region side, W(x) denotes the width of the channel region at the position of a distance x, $\delta$ denotes a substrate charge effect coefficient, L denotes the length from the end of the source region side to the drain side, $V_{DS}$ denotes a gate voltage, $V_T$ denotes a threshold voltage, $W_O$ denotes a standard width of the channel region, and $E_{sat}$ denotes the strength of the carrier velocity saturation electric field.

5 Claims, 4 Drawing Sheets

HYPERBOLIC TYPE CHANNEL MOSFET

BACKGROUND OF THE INVENTION

1. Field of the Invention

The present invention relates to a MOSFET (metal oxide semiconductor field effect transistor) in a semiconductor device and, in particular, to a hyperbolic type channel MOSFET capable of increasing a drain current by determining the width of a channel region according to distances from a source region and a drain region.

2. Description of the Related Art

In recent years, the packaging density of the semiconductor device is increasing and hence a further fine patterning has been required also in the MOSFET. For this reason, the drain current density in the MOSFET has been required to increase.

In order to increase a drain current, there has been conventionally used a method of utilizing the overshoot effect of a carrier. The overshoot effect of a carrier is produced by applying a strong electric field to a channel region of a MOSFET and by shortening the length of the channel region from a source region to a drain region (hereinafter referred to as "channel region length").

In a conventional MOSFET, however, there is presented a problem that even if the electric field applied to the channel region is made stronger, a current is not so much increased. FIG. 1 is a plan view to show the configuration of a conventional MOSFET. As shown in FIG. 1, the conventional MOSFET is composed of a source region 11, a drain region 12, and a channel region 13 disposed between the source region 11 and the drain region 12. The channel region 13 is rectangular. That is, the width of the channel region 13 is set at a constant value $W_0$ along the entire length from the end of the source region 11 side to the end of the drain region 12 side. Further, the width of the source 11 region and the width of the drain region 12 are equal to the width of the neighboring channel region 13. Still further, an insulating layer 14 is formed on the channel region 13 (at the front side of the paper in FIG. 1) and a gate 15 is formed on the insulating layer 14.

In the channel region 13 of the MOSFET shown in FIG. 1, as a position comes near to the end of the drain region 12 side from the end of the source region 11 side along the channel, a difference between a channel potential and a gate potential decreases and the amount of carriers induced in an inversion layer decreases. Since a current continuity law is established in the direction of channel, in order to realize the drain current of a predetermined magnitude to compensate the decreased amount of carriers, a stronger electric field is required to be applied to the channel region to drift the carriers. However, as described above, the amount of carriers in the channel region 13 decreases as the position comes near to the drain region 12 and hence the channel potential increases in gradient as the position comes near to the drain region 12, and hence the potential difference between the source region 11 and the drain region 12 is applied mainly to the vicinity of the drain side end of the channel region 13.

FIG. 2 is a graph to show a channel potential distribution in the conventional MOSFET, in which a horizontal axis designates a distance x from the end of the source region 11 side of the channel region 13 to the direction toward the drain region 12 side and a vertical axis designates a channel potential $Vcs_0$. As shown in FIG. 2, since a very strong electric field is not applied in the direction of the channel in the source region 11 side of the channel region 13, even if the MOSFET has a short channel length, it can not sufficiently benefit the velocity overshoot effect of the carriers because it is hard to produce the velocity overshoot effect of the carriers. As a result, the conventional MOSFET presents a problem that even if the channel length is made short, a drain current value is not improved so much.

SUMMARY OF THE INVENTION

An object of the present invention is to provide a MOSFET capable of making the strength of the electric field uniform in the direction of a channel and increasing a drain current.

A MOSFET according to the present invention comprises: a source region; a drain region; and a channel region disposed between the source region and the drain region. In the channel region, the width of the channel region changes according to the following mathematical equation (1).

$$W(x) = \frac{4\{(1+\delta)E_{sat}L + V_{DD} - V_T\}^2 + \{(1+\delta)E_{sat}L + 2(V_{DD}-V_T)\}(V_{DD}-V_T)}{6\{(1+\delta)E_{sat}L(1-\frac{x}{L}) + V_{DD} - V_T\}\{(1+\delta)E_{sat}L + V_{DD} - V_T\}} W_O \quad (1)$$

In equation (1), x denotes a distance from the end of the source region side to the direction toward the drain region side, W(x) denotes the width of the channel region at the position of the distance x, δ denotes a substrate charge effect coefficient, L denotes the length from the end of the source region side to the end of the drain side, $V_{DD}$ denotes a gate voltage, $V_T$ denotes a threshold voltage, $W_O$ denotes a standard width of the channel region, and $E_{sat}$ denotes a strength of a carrier velocity saturation electric field.

In the present invention, by setting the width of the channel region at the value described above, the total amount of carriers in the direction of width at a position in the channel is not dependent on a distance from the source region and the drain region but is made constant, so an electric field of the same strength can be applied to the entire channel region to maximize a drain current.

Further, it is preferably that, in the above-mentioned MOSFET, the width of the source region is equal to or larger than the width of the channel region at the source region side and the width of the drain region is equal to or larger than the width of the channel region at the end of the drain region side. This can produce the effect described above to a maximum level.

DETAILED DESCRIPTION OF THE PREFERRED EMBODIMENT

Figure 3:
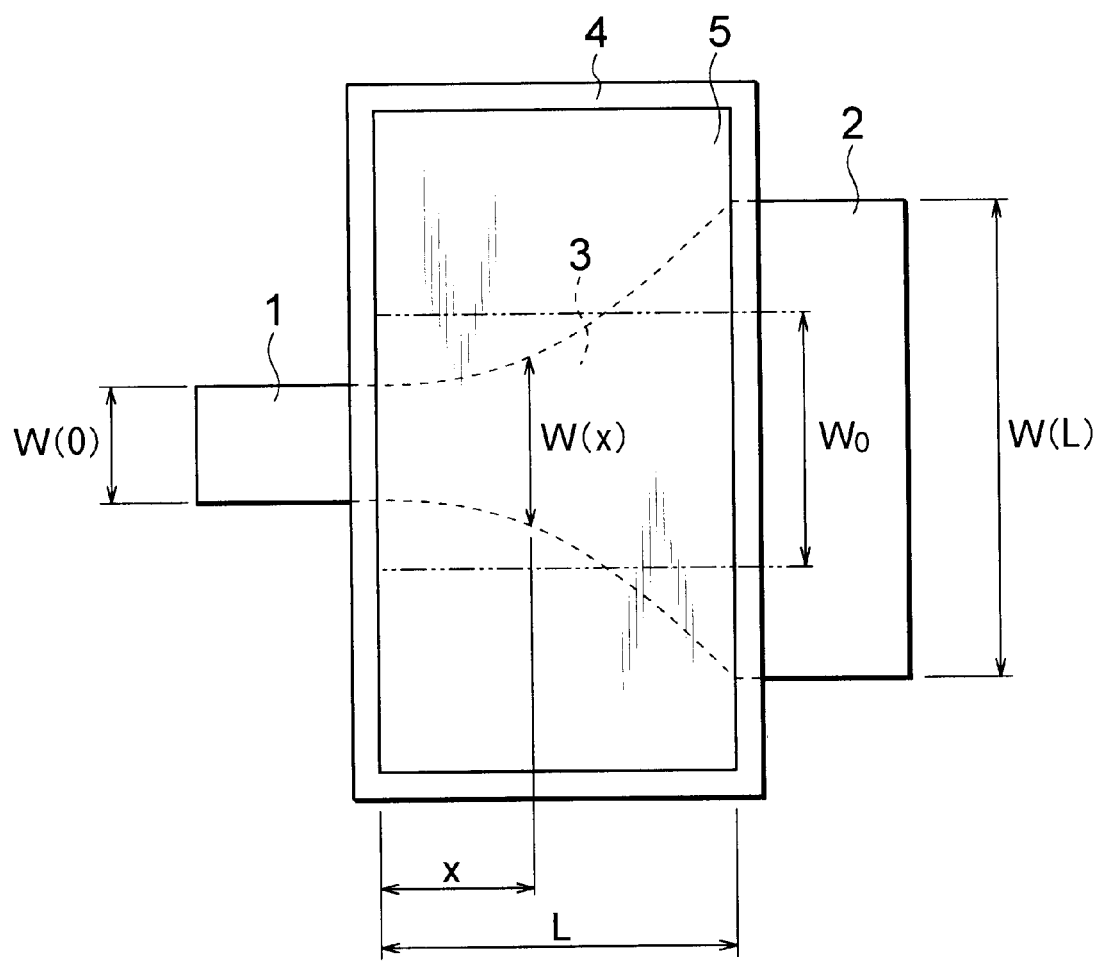
FIG. 3 is a plan view to show the configuration of a MOSFET according to the embodiment of the present invention.

The embodiment according to the present invention will be described in detail with reference to the accompanying drawings. FIG. 3 is a plan view to show the configuration of a MOSFET according to the embodiment of the present invention. As shown in FIG. 3, the MOSFET of the present embodiment is composed of a source region 1, a drain region 2, and a channel region 3 disposed between the source region 1 and the drain region 2. The width W(x) of the channel region 3 extends continuously from the end of the source region 1 side to the end of the drain region 2 side. The width of the channel region 3 follows the mathematical equation (1) described above. Further, the width of the source region 1 and the width of the drain region 2 are equal to the width of neighboring channel region 3. Still further, an insulating layer 4 is formed on the channel region 3 (at the front side of the paper in FIG. 3) and a gate 5 is formed on the insulating layer 4.

The mathematical equation (1) is a result obtained by determining a width function maximizing a drain current, by a variation method, under a constraint condition where the total amount of charges in the channel is kept constant when the drain voltage ($V_{DS}$) is a drain voltage ($V_{dsat}$) at which the drain current starts saturating in the conventional rectangular MOSFET.

In the mathematical equation (1), assuming that a carrier saturation velocity is $V_{sat}$ (cm/sec) and a carrier mobility is $\mu$ (cm$^2$/Vsec), the strength of carrier velocity saturation electric field $E_{sat}$ (V/cm) is expressed by $E_{sat}=2V_{sat}/\mu$. The carrier mobility ($\mu$) can be measured. Also, the carrier saturation velocity ($V_{sat}$) can be estimated by the use of a full-band Monte Carlo simulation disclosed in "Monte Carlo analysis of electron transport in small semiconductor devices including band-structure and space-charge effects" authored by M. V. Fischetti and S. E. Laux, Physical Review B, VOL. 38, NO. 14, Page 9721–9745. Further, the physical meaning of a substrate charge effect coefficient ($\delta$) is described in "Operation and modeling of the MOS transistor", page 123–130, authored by Y. P. Tsividis. Still further, the standard width $W_0$ of the channel region is a width of a channel region of a conventional rectangular MOSFET in which, when $V_{DS}=V_{dsat}$, the amount of all charges in the channel region is equal to that of the MOSFET according to the present invention.

A process of introducing the mathematical equation (1) will be described in the following. Assuming that a channel potential is $V_{cs}$, a charge density is $Q'$, the gate capacitance per a unit area is $C_{OX}$, and the amount of all charges in the channel region is A, the following equations are obtained.

$$I_D = \mu W(x)\{-Q'_I(V_{CS})\}\frac{dV_{CS}}{dx}$$

$$Q'_I(V_{CS}) = -C_{OX}\{V_{GS} - V_T - (1+\delta)V_{CS}\}$$

The object of introducing the mathematical equation (1) is to determine W(x) maximizing the following value, $$W(0)(-Q'_I(0))\frac{dV_{CS}}{dx}\bigg|_{X=0}$$

while keeping the following A at a constant value.

$$A = \int_0^L W(x)\{-Q'_I(V_{CS})\}dx\bigg|_{V_{DS}=V_{dsat}}$$

When the width W of the channel region is a constant value $W_0$, the following equation is obtained, $$A = \int_0^L W(0)(-Q'_I)dx$$

$$= \int_0^{V_{dsat}} \frac{\mu W_0^2}{I_{D0}}Q'^2_I dV_{CS}$$

$$= \int_0^{V_{dsat}} \frac{\mu W_0^2}{I_{D0}}C_{OX}^2\{V_{GS} - V_T - (1+\delta)V_{CS}\}^2 dV_{CS}$$

$$= \frac{\mu W_0^2 C_{OX}^2}{I_{D0}}\left[\frac{-1}{3(1+\delta)}\{V_{GS} - V_T - (1+\delta)V_{CS}\}^3\right]_0^{V_{dsat}}$$

$$= \frac{\mu W_0^2 C_{OX}^2}{I_{D0}} \times \frac{(V_{GS} - V_T)^3}{3(1+\delta)}$$

where $I_{DO}$ is given by the following equation.

$$I_{DO} = \frac{W_0}{L}\mu C_{OX}\left\{(V_{GS}-V_T)V_{DS} - \frac{1}{2}(1+\delta)V_{DS}^2\right\}\bigg|_{V_{DS}=V_{dsat}}$$

$$= \frac{W_0}{L}\mu C_{OX}^2\frac{(V_{GS}-V_T)^2}{2(1+\delta)}$$

Therefore, A is given by the following equation.

$$A = \frac{\mu W_0^2 C_{OX}^2 (V_{GS}-V_T)^3}{3(1+\delta)} \times \frac{L}{W_0 \mu C_{OX}} \times \frac{2(1+\delta)}{(V_{GS}-V_T)^2}$$

$$= \frac{2}{3}LW_0 C_{OX}(V_{GS}-V_T)$$

Assuming that a value of $W(x) \times (-Q_1'.(V_{CS}))$ is equal to a constant value B, A is obtained by following equation.

$$A = \int_0^L B dx$$

$$= BL$$

Therefore, the following equations are obtained.

$$B = \frac{2}{3}W_0 C_{OX}(V_{GS}-V_T)$$

-continued $$W(x) = \frac{B}{-Q'_1(V_{CS})}$$
$$= \frac{2}{3} \frac{W_0 C_{OX}(V_{GS} - V_T)}{C_{OX}\{V_{GS} - V_T - (1+\delta)V_{CS}\}}$$

From the result of the variation method, the following equations are obtained.

$$\frac{dV_{CS}}{dx} = \frac{V_{dsat}}{L} = const$$

$$V_{CS} = \frac{x}{L} V_{dsat}$$

The following equations are obtained by these equations.

$$I_D = W(0)(-Q'_1(0))\mu \frac{dV_{CS}}{dx} \quad (2)$$
$$= \frac{2}{3} W_0 C_{OX}(V_{GS} - V_T)\mu \frac{V_{dsat}}{L}$$
$$= \frac{W_0}{L} \mu C_{OX} \frac{(V_{GS} - V_T)^2}{(1+\delta)} \times \frac{2}{3}$$

$$I_D = \frac{4}{3} I_{D0}$$

$$W(x) = \frac{2}{3} W_0 \frac{(V_{GS} - V_T)}{(V_{GS} - V_T) - (1+\delta)\frac{x}{L}V_{dsat}}$$

$$W(x) = \frac{2}{3} W_0 \frac{1}{\left(1 - \frac{x}{L}\right)}$$

Figure 4:
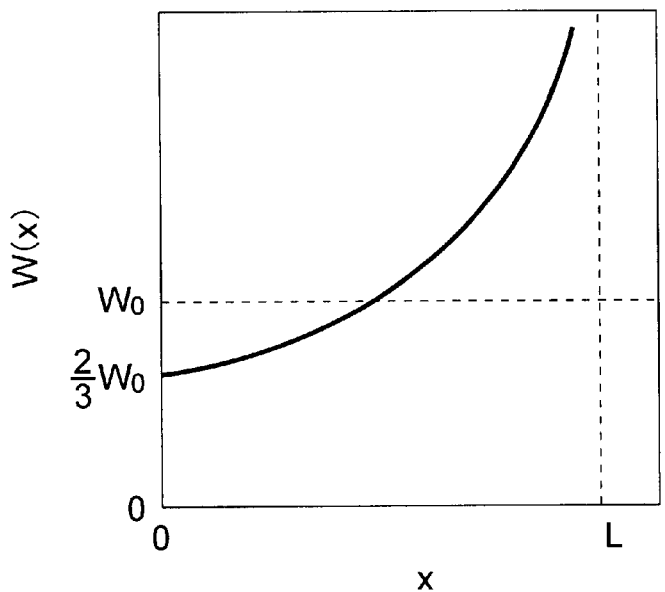
FIG. 4 is a graph to show a relationship between x and W(x) satisfying the mathematical equation (2), in which a horizontal axis designates a distance x from the end of the source region 1 side of the channel region 3 to the direction toward the drain region 2 side and a vertical axis designates a width W(x) of the channel region 3 at the position of a distance x.

FIG. 4 is a graph to show a relationship between x and W(x) satisfying the mathematical equation (2) described above, in which a horizontal axis designates a distance x from the end of the source region 1 side of the channel region 3 to the direction toward the drain region 2 side and a vertical axis designates a width W(x) of the channel region 3 at the position of a distance x.

In order to eliminate the singularity at x=L, the velocity saturation type equation of BSIM is utilized.

$$A = \int_0^L W_0(-Q'_1)dx \quad (3)$$

$$Q'_1 = -C_{OX}\{V_{GS} - V_T - (1+\delta)V_{CS}\}$$

$$\frac{dV_{CS}}{dx} = \frac{I_{D0}}{\mu W_0 C_{OX}\{V_{GS} - V_T - (1+\delta)V_{CS}\} - \frac{I_{D0}}{E_{sat}}}$$

$$dx = \left[\frac{\mu W_0 C_{OX}}{I_{D0}}\{V_{GS} - V_T - (1+\delta)V_{CS}\} - \frac{1}{E_{sat}}\right]dV_{CS}$$

$$A = W_0 \int_0^{V_{dsat}} \left[\frac{\mu W_0 C_{OX}^2}{I_{D0}}\{V_{GS} - V_T - (1+\delta)V_{CS}\}^2 - \frac{C_{OX}}{E_{sat}}\{V_{GS} - V_T - (1+\delta)V_{CS}\}\right]dV_{CS}$$

$$A = W_0 \left[-\frac{\mu W_0 C_{OX}^2}{3(1+\delta)I_{D0}}\{V_{GS} - V_T - (1+\delta)V_{CS}\}^3 + \frac{C_{OX}}{2(1+\delta)E_{sat}}\{V_{GS} - V_T - (1+\delta)V_{CS}\}^2\right]_0^{V_{dsat}}$$

-continued $$A = \frac{\mu W_0^2 C_{OX}^2}{3(1+\delta)I_{D0}}[(V_{GS} - V_T)^3 - \{V_{GS} - V_T - (1+\delta)V_{dsat}\}^3] -$$
$$\frac{W_0 C_{OX}}{2(1+\delta)E_{sat}}[(V_{GS} - V_T)^2 - \{V_{GS} - V_T - (1+\delta)V_{dsat}\}^2]$$

Also, $I_{DO}$ is given by the following equation.

$$I_{D0} = \mu C_{OX} \frac{W_0}{L} \frac{1}{1 + \frac{V_{dsat}}{E_{sat}L}} \left\{V_{GS} - V_T - \frac{(1+\delta)}{2}V_{dsat}\right\}V_{dsat}$$

By substituting the $I_{DO}$ into the mathematical equation (3), the following mathematical equation is obtained.

$$A = \frac{W_0^2 C_{OX}^2}{3(1+\delta)} \times \frac{L}{C_{OX} W_0} \left(1 + \frac{V_{dsat}}{E_{sat}L}\right) \times \quad (4)$$
$$\frac{(V_{CS} - V_T)^3 - \{V_{GS} - V_T - (1+\delta)V_{dsat}\}^3}{\left\{V_{GS} - V_T - \frac{1+\delta}{2}V_{dsat}\right\}V_{dsat}} -$$
$$\frac{W_0 C_{OX}}{2(1+\delta)E_{sat}}[(V_{GS} - V_T)^2 - \{V_{GS} - V_T - (1+\delta)V_{dsat}\}^2]$$

$$A = \frac{W_0 C_{OX}}{3(1+\delta)} L\left(1 + \frac{V_{dsat}}{E_{sat}L}\right) \times$$
$$\frac{(V_{CS} - V_T)^3 - \{V_{GS} - V_T - (1+\delta)V_{dsat}\}^3}{\left\{V_{GS} - V_T - \frac{1+\delta}{2}V_{dsat}\right\}V_{dsat}} -$$
$$\frac{W_0 C_{OX}}{2(1+\delta)E_{sat}}[(V_{GS} - V_T)^2 - \{V_{GS} - V_T - (1+\delta)V_{dsat}\}^2]$$

Further, the following equation is assumed in BSIM.

$$V_{dsat} = \frac{E_{sat}L(V_{GS} - V_T)}{(1+\delta)E_{sat}L + V_{GS} - V_T}$$

By the equation, this equation is changed as follows.

$$V_{GS} - V_T - (1+\delta)V_{dsat} = V_{GS} - V_T - \frac{(1+\delta)E_{sat}L(V_{GS} - V_T)}{(1+\delta)E_{sat}L + V_{GS} - V_T}$$
$$= \frac{(V_{GS} - V_T)^2}{(1+\delta)E_{sat}L + V_{GS} - V_T}$$

Therefore, following equation is obtained.

$$V_{GS} - V_T - \frac{(1+\delta)}{2}V_{dsat} = \frac{1}{2} \times \frac{2(V_{GS} - V_T)^2 + (1+\delta)E_{sat}L(V_{GS} - V_T)}{(1+\delta)E_{sat}L + V_{GS} - V_T}$$
$$= \frac{(V_{GS} - V_T) + \frac{1}{2}(1+\delta)E_{sat}L}{(1+\delta)E_{sat}L + V_{GS} - V_T}(V_{GS} - V_T)$$

Therefore, following equation is obtained.

$$1 + \frac{V_{dsat}}{E_{sat}L} = 1 + \frac{V_{GS} - V_T}{(1+\delta)E_{sat}L + V_{GS} - V_T}$$
$$= \frac{2(V_{GS} - V_T) + (1+\delta)E_{sat}L}{(1+\delta)E_{sat}L + V_{GS} - V_T}$$

When these mathematical equations are substituted into the mathematical equation (4), the following equation can be obtained.

$$A = \frac{W_0 C_{OX}}{3(1+\delta)} L \frac{2(V_{GS} - V_T) + (1+\delta)E_{sat}L}{(1+\delta)E_{sat}L + V_{GS} - V_T} \times$$

$$\frac{\{(1+\delta)E_{sat}L + V_{GS} - V_T\}^3 (V_{GS} - V_T)^3 - (V_{GS} - V_T)^6}{\{(1+\delta)E_{sat}L + V_{GS} - V_T\}^3} -$$

$$\frac{(V_{GS} - V_T) + \frac{1}{2}(1+\delta)E_{sat}L}{(1+\delta)E_{sat}L + V_{GS} - V_T}(V_{GS} - V_T)\frac{E_{sat}L(V_{GS} - V_T)}{(1+\delta)E_{sat}L + V_{GS} - V_T}$$

$$\frac{W_0 C_{OX}}{2(1+\delta)E_{sat}L} \times \frac{\{(1+\delta)E_{sat}L + V_{GS} - V_T\}^2 (V_{GS} - V_T)^2 - (V_{GS} - V_T)^4}{\{(1+\delta)E_{sat}L + V_{GS} - V_T\}^2}$$

$$= \frac{2W_0 C_{OX}}{3(1+\delta)E_{sat}} \times \frac{(V_{GS} - V_T)[\{(1+\delta)E_{sat}L + V_{GS} - V_T\}^3 - (V_{GS} - V_T)^3]}{\{(1+\delta)E_{sat}L + V_{GD} - V_T\}^2} -$$

$$\frac{W_0 C_{OX}}{2(1+\delta)E_{sat}} \times \frac{(V_{GS} - V_T)^2(1+\delta)E_{sat}L\{(1+\delta)E_{sat}L + 2(V_{GS} - V_T)\}}{\{(1+\delta)E_{sat}L + V_{GS} - V_T\}^2}$$

$$= \frac{LW_0 C_{OX}}{6} \times \frac{(V_{GS} - V_T)}{\{(1+\delta)E_{sat}L + V_{GS} - V_T\}^2} \times$$

$$[4\{(1+\delta)E_{sat}L\}^2 + 8(1+\delta)E_{sat}L(V_{GS} - V_T) + 4(V_{GS} - V_T)^2 +$$

$$4(1+\delta)E_{sat}L(V_{GS} - V_T) + 4(V_{GS} - V_T)^2 + 4(V_{GS} - V_T)^2 -$$

$$3(1+\delta)E_{sat}L(V_{GS} - V_T) - 6(V_{GS} - V_T)^2]$$

$$= \frac{LW_0 C_{OX}}{6} \times \frac{(V_{GS} - V_T)}{\{(1+\delta)E_{sat}L + V_{GS} - V_T\}^2} \times$$

$$[4\{(1+\delta)E_{sat}L + V_{GS} - V_T\}^2 \times \{(1+\delta)E_{sat}L + 2(V_{GS} - V_T)\}(V_{GS} - V_T)]$$

Assuming that a value of $W(x) \times (-Q_1'(V_{CS}))$ is equal to a constant value B, the following equations are obtained.

$$A = \int_0^L B \, dx = BL$$

$$B = \frac{W_0 C_{OX}}{6} \times \frac{(V_{GS} - V_T)}{\{(1+\delta)E_{sat}L + V_{GS} - V_T\}^2} \times$$

$$[4\{(1+\delta)E_{sat}L + V_{GS} - V_T\}^2 +$$

$$\{(1+\delta)E_{sat}L + 2(V_{GS} - V_T)\}(V_{GS} - V_T)]$$

$$W(x) = \frac{B}{-Q_1'(V_{CS})}$$

$$= \frac{B}{C_{OX}\{V_{GS} - V_T - (1+\delta)V_{CS}\}}$$

On the other hand, since the following mathematical equation is established, $I_D$ is determined as follows.

$$I_D = \mu W_0 C_{OX}\{V_{GS} - V_T - (1+\delta)V_{CS}\}\frac{dV_{CS}}{dx} - \frac{1}{E_{sat}} \times \frac{dV_{CS}}{dx} I_D$$

$$I_D = \frac{\mu W_0 C_{OX}\{V_{GS} - V_T - (1+\delta)V_{CS}\}\frac{dV_{CS}}{dx}}{\left(1 + \frac{1}{E_{sat}}\frac{dV_{CS}}{dx}\right)}$$

According to a variational principle, the following equation is obtained.

$$\mu \frac{dV_{CS}}{dx} - \lambda\left(1 + \frac{1}{E_{sat}}\frac{dV_{CS}}{dx}\right) = 0$$

$$\left(\mu - \frac{\lambda}{E_{sat}}\right)\frac{dV_{CS}}{dx} = \lambda$$

$$\therefore \frac{dV_{CS}}{dx} = const$$

$$V_{CS} = \frac{x}{L} V_{dsat} = \frac{E_{sat}(V_{GS} - V_T)}{(1+\delta)E_{sat}L + V_{GS} - V_T} x$$

Therefore, the following equation is obtained.

$$W(x) = \frac{B}{C_{OX}\left\{V_{GS} - V_T - \frac{(1+\delta)E_{sat}L(V_{GS} - V_T)}{(1+\delta)E_{sat}L + V_{GS} - V_T} \times \frac{x}{L}\right\}}$$

$$W(x) = \frac{B\{(1+\delta)E_{sat}L + V_{GS} - V_T\}}{C_{OX}\left\{(1+\delta)E_{sat}L(V_{GS} - V_T)\left(1 - \frac{x}{L}\right) + (V_{GS} - V_T)^2\right\}}$$

$$= \frac{W_0}{6} \times \frac{V_{GS} - V_T}{(1+\delta)E_{sat}L(V_{GS} - V_T)\left(1 - \frac{x}{L}\right) + (V_{GS} - V_T)^2} \times$$

$$\{4\{(1+\delta)E_{sat}L + V_{GS} - V_T\}^2 +$$

$$\frac{\{(1+\delta)E_{sat}L + 2(V_{GS} - V_T)\}(V_{GS} - V_T)}{(1+\delta)E_{sat}L + V_{GS} - V_T}$$

By further changing this equation, the following mathematical equation (1) is derived.

$$W(x) = \frac{4\{(1+\delta)E_{sat}L + V_{DD} - V_T\}^2 +}{6\left\{(1+\delta)E_{sat}L\left(1 - \frac{x}{L}\right) + V_{DD} - V_T\right\}} W_0 \quad (1)$$

$$\{(1+\delta)E_{sat}L + V_{DD} - V_T\}$$

For example, assuming that an n-type MOSFET has a channel region length L of 0.05 μm, $V_{DD}$ is 1.0V, $V_T$ is 0.2V, δ is 0.25, μ is 300 cm$^2$/Vsec, and $V_{sat}$ is 2×10$^7$ cm/sec in consideration of the velocity overshoot effect of the electron, these values are substituted into the mathematical equation (1). As a result, the mathematical equation (1) is expressed by the mathematical equation (5).

$$W(x) = \frac{12.62}{8.17\left(1 - \frac{x[cm]}{5 \times 10^{-6}}\right) + 7.84} W_0 \quad (5)$$

Next, the operation of the present embodiment will be described. If the width of the channel region is set such that it satisfies the mathematical equation (1), when $V_{DS}=V_{dsat}$, the amount of all the charges in the inversion layer integrated in the direction of channel width at a position x in the channel region is not dependent on x but is kept at a constant value.

Figure 5:
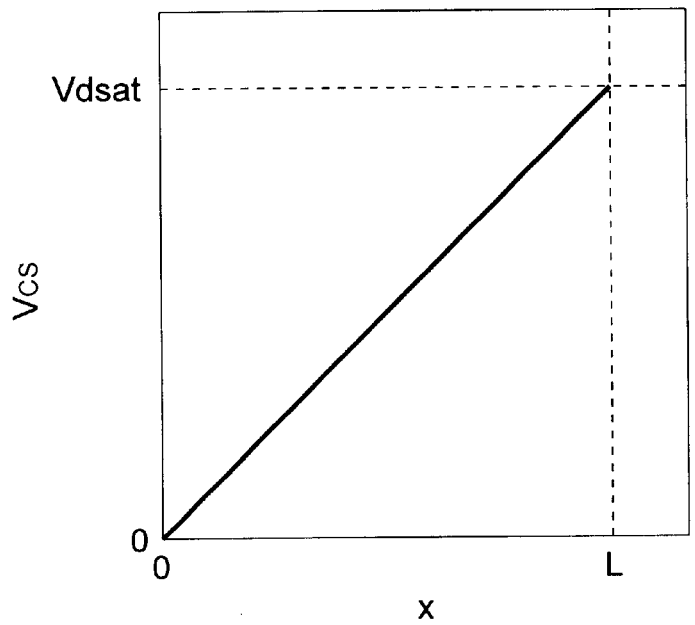
FIG. 5 is a graph to show a channel potential distribution of the MOSFET according to the present embodiment, in which a horizontal axis designates a distance x from the end of the source region 1 side of the channel region 3 to the direction toward the drain region 2 side and a vertical axis designates a channel potential $V_{cs}$.

FIG. 5 is a graph to show a channel potential distribution of the MOSFET according to the present embodiment, in which a horizontal axis designates a distance x from the end of the source region 1 side of the channel region 3 to the direction toward the drain region 2 side and a vertical axis designates a channel potential $V_{cs}$. FIG. 5 is a graph to show a channel potential $V_{CS}$ (x) when $V_{DS}=V_{dsat}$. As shown in FIG. 5, in the present embodiment, when $V_{DS}=V_{dsat}$, the channel potential $V_{CS}$ (x) changes linearly along the direction of the channel. For this reason, a stronger electric field is applied in the direction of the channel at the end of the source side of the channel region.

Figure 1:
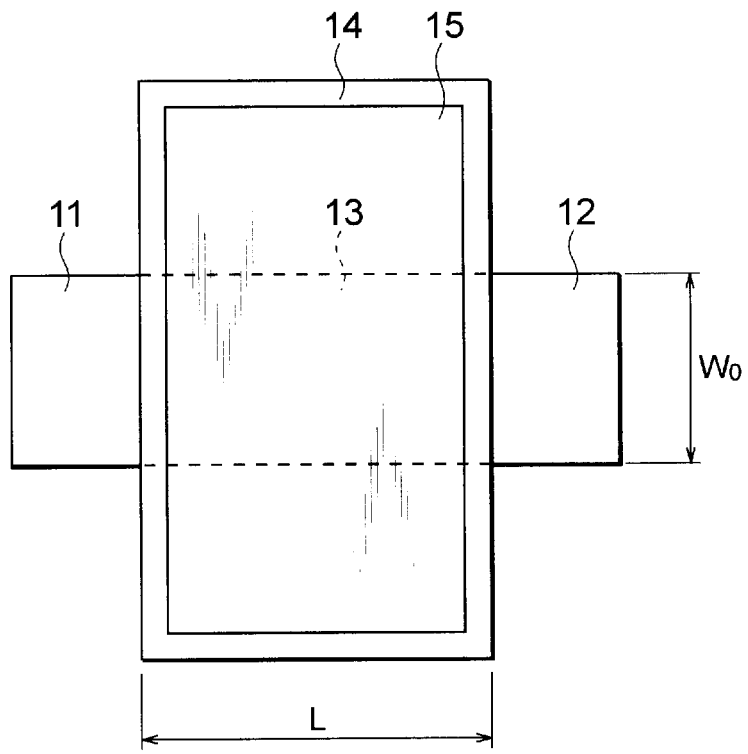
FIG. 1 is a plan view to show the configuration of a conventional MOSFET.
Figure 2:
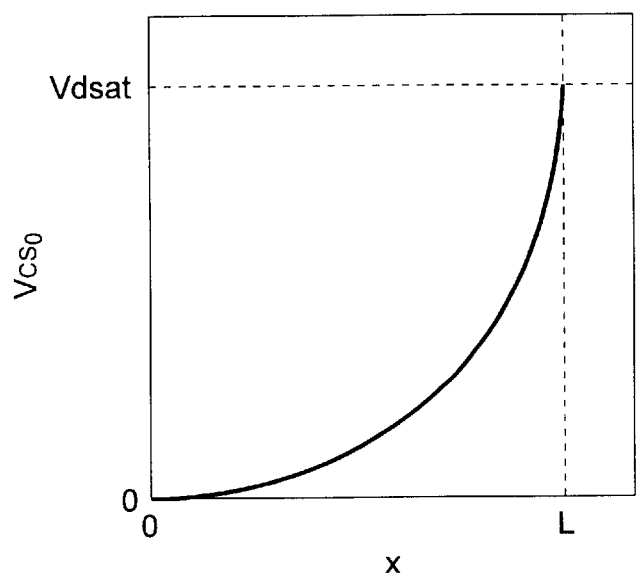
FIG. 2 is a graph to show a channel potential distribution in a conventional MOSFET, in which a horizontal axis designates a distance x from the end of the source region 11 side of the channel region 13 to the direction toward the drain region 12 side and a vertical axis designates a channel potential $Vcs_0$.

On the other hand, when $V_{DS}=V_{dsat}$, the width of the channel region in the conventional rectangular MOSFET in which the amount of all the charges in the channel region is equal to that of the MOSFET of the present embodiment is $W_0$ (see FIG. 1). In this MOSFET, the width of the channel region does not change according to the mathematical equation (1) and hence, as shown in FIG. 2, the gradient of the channel potential $V_{CS}$ decreases in the vicinity of the source region.

Figure 6:
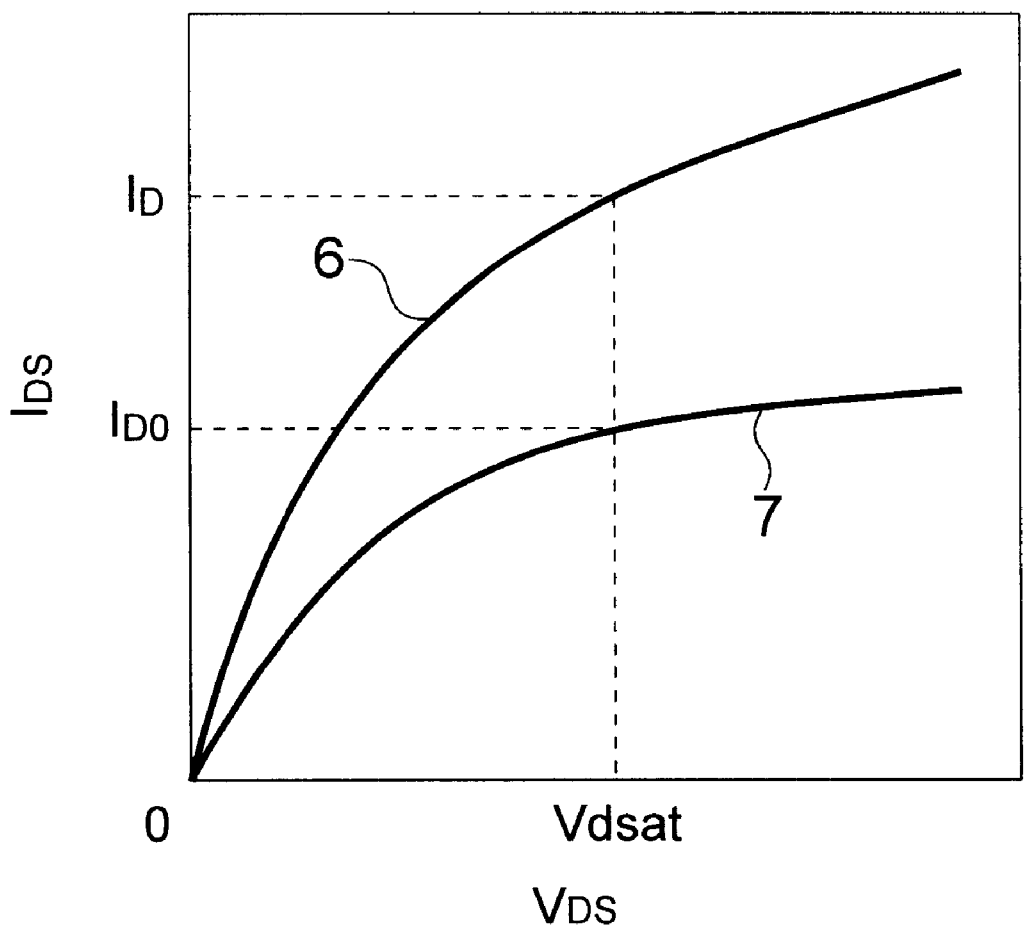
FIG. 6 is a graph to show a relationship between a drain voltage $V_{DS}$ and a drain current $I_{DS}$ when a gate voltage is set at a constant value $V_{DD}$, in which a horizontal axis designates the drain voltage $V_{DS}$ and a vertical axis designates the drain current $I_{DS}$.

Next, the effect of the present embodiment will be described. FIG. 6 is a graph to show a relationship between a drain voltage $V_{DS}$ and a drain current $I_{DS}$ when a gate voltage is set at a constant value $V_{DD}$, in which a horizontal axis designates the drain voltage $V_{DS}$ and a vertical axis designates the drain current $I_{DS}$. In FIG. 6, a line 6 shows the relationship between the drain voltage $V_{DS}$ and the drain current $I_{DS}$ in the MOSFET of the present embodiment, and a line 7 shows the relationship between the drain voltage $V_{DS}$ and the drain current $I_{DS}$ in a conventional MOSFET in which the width of the channel region is a constant value $W_0$. As shown in FIG. 6, the drain current $I_{DS}$ (shown by the line 6) in the MOSFET of the present embodiment becomes larger than the drain current $I_{DS}$ (shown by the line 7) in the conventional MOSFET in which the width of the channel region is a constant value $W_0$. When $V_{DS}=V_{dsat}$, the ration $(I_D/I_{D0})$ between them is expressed by the following mathematical equation (6).

From the results of calculation described above, the following equation is obtained.

$$I_D = W(0)(-Q'_I(0))\mu \frac{dV_{CS}}{dx}$$

$$= \frac{B}{C_{OX}(V_{GS}-V_T)} \times (V_{GS}-V_T)\mu \frac{E_{sat}(V_{GS}-V_T)}{(1+\delta)E_{sat}L+V_{GS}-V_T}$$

$$= B\mu \frac{E_{sat}(V_{GS}-V_T)}{(1+\delta)E_{sat}L+V_{GS}-V_T}$$

On the other hand, the following equation is obtained.

$$I_{D0} = \mu C_{OX} \frac{W_0}{L} \times \frac{(1+\delta)E_{sat}L+V_{GS}-V_T}{2(V_{GS}-V_T)+(1+\delta)E_{sat}L} \times$$

$$\frac{(V_{GS}-V_T)+\frac{1}{2}(1+\delta)E_{sat}L}{(1+\delta)E_{sat}L+V_{GS}-V_T}(V_{GS}-V_T)\frac{E_{sat}L(V_{GS}-V_T)}{(1+\delta)E_{sat}L+V_{GS}-V_T}$$

$$= \mu C_{OX} \frac{W_0}{L} \times \frac{1}{2} \times \frac{E_{sat}L(V_{GS}-V_T)^2}{(1+\delta)E_{sat}L+V_{GS}-V_T}$$

$$\therefore \frac{I_D}{I_{D0}} = B\mu \frac{E_{sat}(V_{GS}-V_T)}{(1+\delta)E_{sat}L+V_{GS}-V_T} \times \frac{2L}{\mu C_{OX}W_0} \times \frac{(1+\delta)E_{sat}L+V_{GS}-V_T}{E_{sat}L(V_{GS}-V_T)^2}$$

$$= \frac{2B}{W_0 C_{OX}(V_{GS}-V_T)}$$

$$= 2\frac{W_0 C_{OX}}{6} \times \frac{1}{W_0 C_{OX}\{(1+\delta)E_{sat}L+V_{GS}-V_T\}^2} \times$$

$$[4\{(1+\delta)E_{sat}L+V_{GS}-V_T\}^2 +$$

$$\{(1+\delta)E_{sat}L+2(V_{GS}-V_T)\}(V_{GS}-V_T)]$$

By further changing this mathematical equation, the following mathematical equation (6) is obtained at $V_{GS}=V_{DD}$.

$$\frac{I_D}{I_{D0}} = \frac{[4\{(1+\delta)E_{sat}L+V_{DD}-V_T\}^2 + \{(1+\delta)E_{sat}L+2(V_{DD}-V_T)\}(V_{DD}-V_T)]}{3\{(1+\delta)E_{sat}L+V_{DD}-V_T\}^2} \quad (6)$$

If the conditions under which the mathematical equation (5) is derived, that is, L=0.05 $\mu$m, $V_{DD}$=1.0 V, $V_T$=0.2 V, $\delta$=0.25, $\mu$=300 cm$^2$/Vsec, and $V_{sat}$=2×10$^7$ cm/sec, are substituted into the mathematical equation (6), then the value of $(I_D/I_{D0})$ becomes 1.58. Therefore, the MOSFET of the present invention can increase the drain current in comparison with the conventional MOSFET in which the amount of all the charges in the channel region, when $V_{DS}=V_{dsat}$, is equal to that of the MOSFET of the present invention.

On the other hand, assuming that the gate capacitance per a unit area is $C_{OX}$, the amount of all the charges $Q_{CH}$ in the inversion layer in the channel region when $V_{DS}=V_{dsat}$ is expressed by the following mathematical equation (7). As shown in the following mathematical equation (7), the amount of all the charges in the inversion layer in the MOSFET of the present invention is equal to the amount of all the charges in the inversion layer in the conventional MOSFET in which the width of the channel region is $W_O$. Therefore, the present invention can increase the drain current while keeping the channel capacitance when $V_{DS}=V_{dsat}$ at the same value as the conventional MOSFET.

$$Q_{CH} = \int_0^L W_0 C_{OX}\{V_{DD}-V_T-(1+\delta)V_{CS0}(c)\}dx \quad (7)$$

$$= \int_0^L W_0 C_{OX}\{V_{DD}-V_T-(1+\delta)V_{CS}(x)\}dx$$

As described above, according to the present invention, by suitably selecting the width of the channel region according to distances from the source region and the drain region, the drain current of the MOSFET can remarkably be increased.

What is claimed is:

1. A hyperbolic type channel MOSFET comprising:

a source region;

a drain region; and a channel region disposed between said source region and said drain region; in said channel region, the width of said channel region changing such that the width W(x) of the source region is smaller than the width W(x) of the drain region for all values of x, wherein a distance from the end of the source region side to the direction toward the drain region side is x, and the width of said channel region at the position of the distance x is W(x).

2. The hyperbolic type channel MOSFET according to claim 1, wherein the width of said source region is equal to or larger than the neighboring channel region.

3. The hyperbolic type channel MOSFET according to claim 1, wherein the width of said drain region is equal to or larger than the neighboring channel region.

4. The hyperbolic type channel MOSFET according to claim 1, further comprising: an insulating film formed on said channel region; and a gate electrode formed on said insulating film.

5. The hyperbolic type channel MOSFET according to claim 1, wherein the width of said channel region changes according to the following mathematical equation:

$$W(x) = \frac{4\{(1+\delta)E_{sat}L+V_{DD}-V_T\}^2 + \{(1+\delta)E_{sat}L+2(V_{DD}-V_T)\}(V_{DD}-V_T)}{6\{(1+\delta)E_{sat}L(1-x/L)+V_{DD}-V_T\}\{(1+\delta)E_{sat}L+V_{DD}-V_T\}} W_o$$

wherein said distance from the end of the source region side to the direction toward the drain region side is x, said width of said channel region at the position of the distance x is W(x), a substrate charge effect coefficient is $\delta$, the length from the end of the source region side to the end of the drain side is L, a gate voltage is $V_{DD}$, a threshold voltage is $V_T$, a standard width of the channel region is $W_0$, and a strength of a carrier velocity saturation electric field is $E_{sat}$.

* * * * *